US012710459B2

(12) United States Patent
Seong et al.

(10) Patent No.: US 12,710,459 B2
(45) Date of Patent: Aug. 18, 2026

(54) INSPECTING APPARATUS AND SEMICONDUCTOR MANUFACTURING EQUIPMENT INCLUDING THE SAME

(71) Applicant: SEMES CO., LTD., Chungcheongnam-do (KR)

(72) Inventors: Hyo Seong Seong, Gyeongsangnam-do (KR); Tae Hoon Jo, Seoul (KR); Soon Min Kwon, Gyeonggi-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 188 days.

(21) Appl. No.: 18/798,841

(22) Filed: Aug. 9, 2024

(65) Prior Publication Data

US 2025/0085320 A1 Mar. 13, 2025

(30) Foreign Application Priority Data

Sep. 11, 2023 (KR) ........................ 10-2023-0120286

(51) Int. Cl.
*G01R 31/56* (2020.01)
*G01R 27/02* (2006.01)
*H01J 37/32* (2006.01)

(52) U.S. Cl.
CPC ............. *G01R 27/02* (2013.01); *G01R 31/56* (2020.01); *H01J 37/32935* (2013.01)

(58) Field of Classification Search
CPC ................................ G01R 27/02; G01R 31/56
See application file for complete search history.

(56) References Cited

U.S. PATENT DOCUMENTS

2006/0220574 A1* 10/2006 Ogawa .............. H01J 37/32183 315/111.21

FOREIGN PATENT DOCUMENTS

| | | | | |
|---|---|---|---|---|
| EP | 1023771 B1 * | 1/2007 | ............... H03H 7/40 |
| KR | 10-2017-0028359 | 3/2017 | |
| KR | 10-2022-0147346 | 11/2022 | |
| KR | 10-2022-0154804 | 11/2022 | |

* cited by examiner

*Primary Examiner* — Benyam Haile
(74) *Attorney, Agent, or Firm* — WOMBLE BOND DICKINSON (US) LLP

(57) ABSTRACT

An inspecting apparatus capable of performing an inspection of equipment without destroying the equipment and semiconductor manufacturing equipment including the inspecting apparatus are provided. The inspecting apparatus includes: a measurement module measuring a first impedance at a first port, and a second impedance at a second port; a comparison module comparing the first and second impedances; and a determination module determining whether the equipment part is operating properly based on a result of the comparison of the first and second impedances, wherein the first impedance includes a first resistance and a first reactance, the second impedance includes a second resistance and a second reactance, and the determination module determines whether the equipment part is operating properly based on at least one of a result of the comparison of the first and second resistances and a result of the comparison of the first and second reactances.

20 Claims, 13 Drawing Sheets

INSPECTING APPARATUS AND SEMICONDUCTOR MANUFACTURING EQUIPMENT INCLUDING THE SAME

CROSS-REFERENCE TO RELATED APPLICATION

This application claims priority from Korean Patent Application No. 10-2023-0120286 filed on Sep. 11, 2023 in the Korean Intellectual Property Office, and all the benefits accruing therefrom under 35 U.S.C. 119, the contents of which in its entirety are herein incorporated by reference.

BACKGROUND

1. Field

The present disclosure relates to an inspecting apparatus inspecting equipment that treats substrates and semiconductor manufacturing equipment including the inspecting apparatus.

2. Description of the Related Art

Equipment that treats substrates using plasma can be inspected based on data such as voltage or current data obtained while using the equipment. If it is determined that the equipment is not operating properly, part of the equipment suspected of malfunctioning can be replaced, and the equipment can be inspected again. However, this type of inspection method has the issue of requiring the destruction of the equipment, and if the relevant part is found to be operating normally, there is the issue of needing to re-inspect the equipment.

SUMMARY

Aspects of the present disclosure provide an inspecting apparatus capable of conducting a high-reliability inspection of equipment without destroying the equipment and semiconductor manufacturing equipment including the inspecting apparatus.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, an inspecting apparatus includes: a measurement module measuring a first impedance at a first port, which is provided on one side of an equipment part in a substrate treating apparatus, and a second impedance at a second port, which is provided on the other side of the equipment part; a comparison module comparing the first and second impedances; and a determination module determining whether the equipment part is operating properly based on a result of the comparison of the first and second impedances, wherein the first impedance includes a first resistance and a first reactance, the second impedance includes a second resistance and a second reactance, and the determination module determines whether the equipment part is operating properly based on at least one of a result of the comparison of the first and second resistances and a result of the comparison of the first and second reactances.

According to another aspect of the present disclosure, semiconductor manufacturing equipment includes: a substrate treating apparatus treating substrates using plasma; and an inspecting apparatus determining whether an equipment part in the substrate treating apparatus is operating properly, wherein the inspecting apparatus includes a measurement module measuring a first impedance at a first port, which is provided on one side of an equipment part in a substrate treating apparatus, and a second impedance at a second port, which is provided on the other side of the equipment part, a comparison module comparing the first and second impedances, and a determination module determining whether the equipment part is operating properly based on a result of the comparison of the first and second impedances, the first impedance includes a first resistance and a first reactance, the second impedance includes a second resistance and a second reactance, and the determination module determines whether the equipment part is operating properly based on at least one of a result of the comparison of the first and second resistances and a result of the comparison of the first and second reactances.

According to another aspect of the present disclosure, an inspecting apparatus inspecting an equipment part in a substrate treating apparatus, based on an input impedance measurement theory, includes: a measurement module measuring a first impedance at a first port, which is provided on one side of the equipment part, and a second impedance at a second port, which is provided on the other side of the equipment part; a comparison module comparing the first and second impedances; and a determination module determining whether the equipment part is operating properly based on a result of the comparison of the first and second impedances, wherein the first impedance includes a first resistance and a first reactance, the second impedance includes a second resistance and a second reactance, the comparison module compares the first and second resistances and compares the first and second reactances, using one of an absolute value comparison method and a difference comparison method, the determination module determines whether the equipment part is operating normally based on at least one of first and second conditions, the first condition is whether a result of the comparison of the first and second resistances is equal to or less than a first or third reference value, the second condition is whether a result of the comparison of the first and second reactances is equal to or less than a second or fourth reference value, and the determination module determines that the equipment part is operating properly if the first and second conditions are both satisfied.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Figure 1:
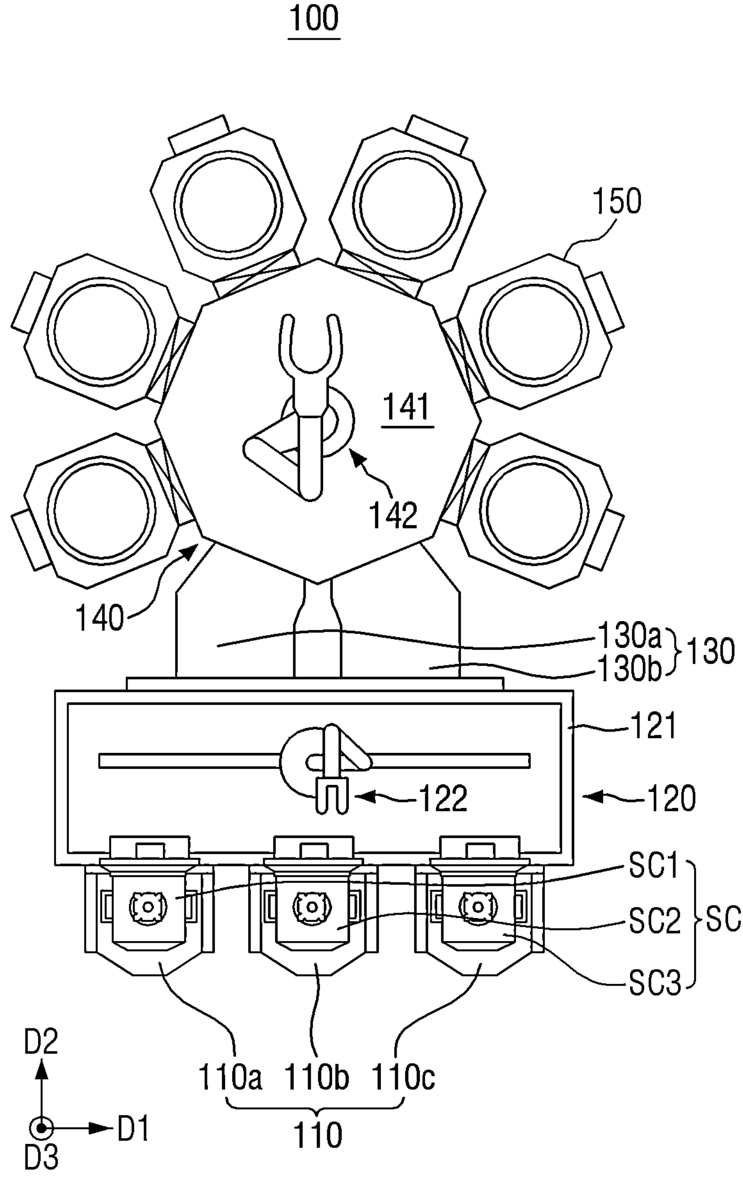
FIG. 1 is a first exemplary schematic view illustrating the internal configuration of semiconductor manufacturing equipment for treating substrates.

Embodiments of the present disclosure will hereinafter be described with reference to the accompanying drawings. The same reference numerals are used for identical components in the drawings, and redundant explanations for these components are omitted.

When treating substrates in equipment using plasma, it is necessary to frequently inspect the equipment using an inspecting apparatus to prevent the mass production of defective products due to a decreased processing efficiency. A substrate treating apparatus and semiconductor manufacturing equipment including the substrate treating apparatus will hereinafter be described first, and then, an inspecting apparatus that inspects the semiconductor manufacturing equipment will be described.

Figure 2:
FIG. 2 is a second exemplary schematic view illustrating the internal configuration of the semiconductor manufacturing equipment for treating substrates.
Figure 2:
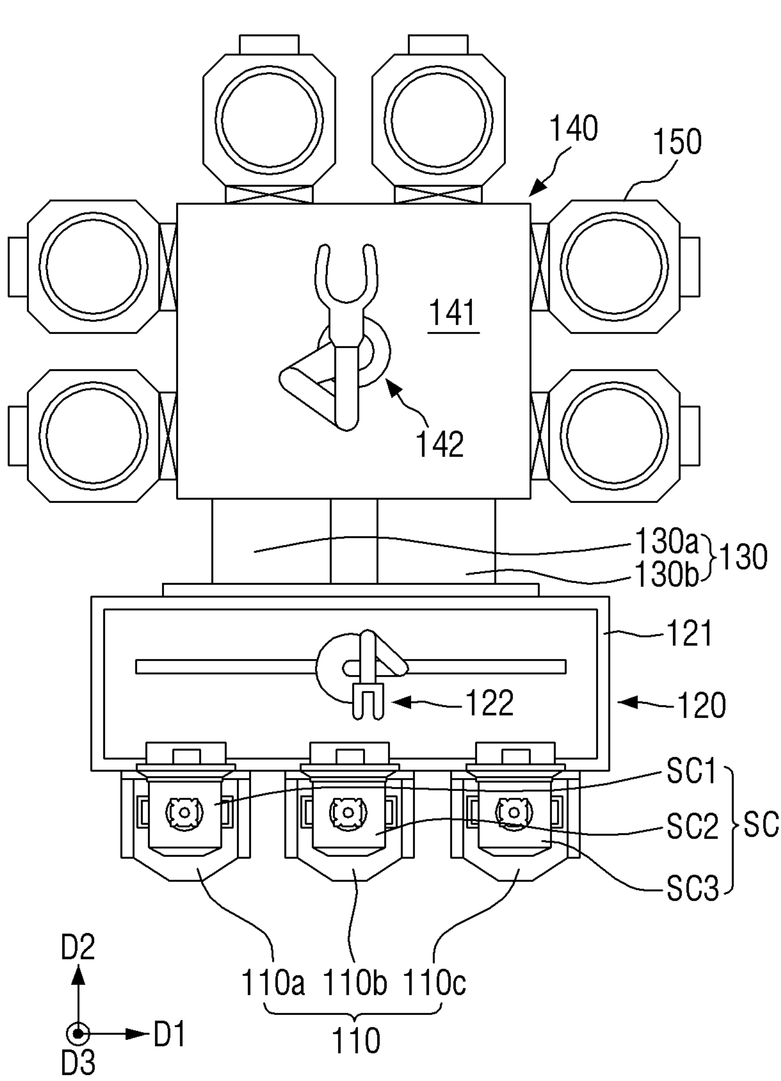
Figure 3:
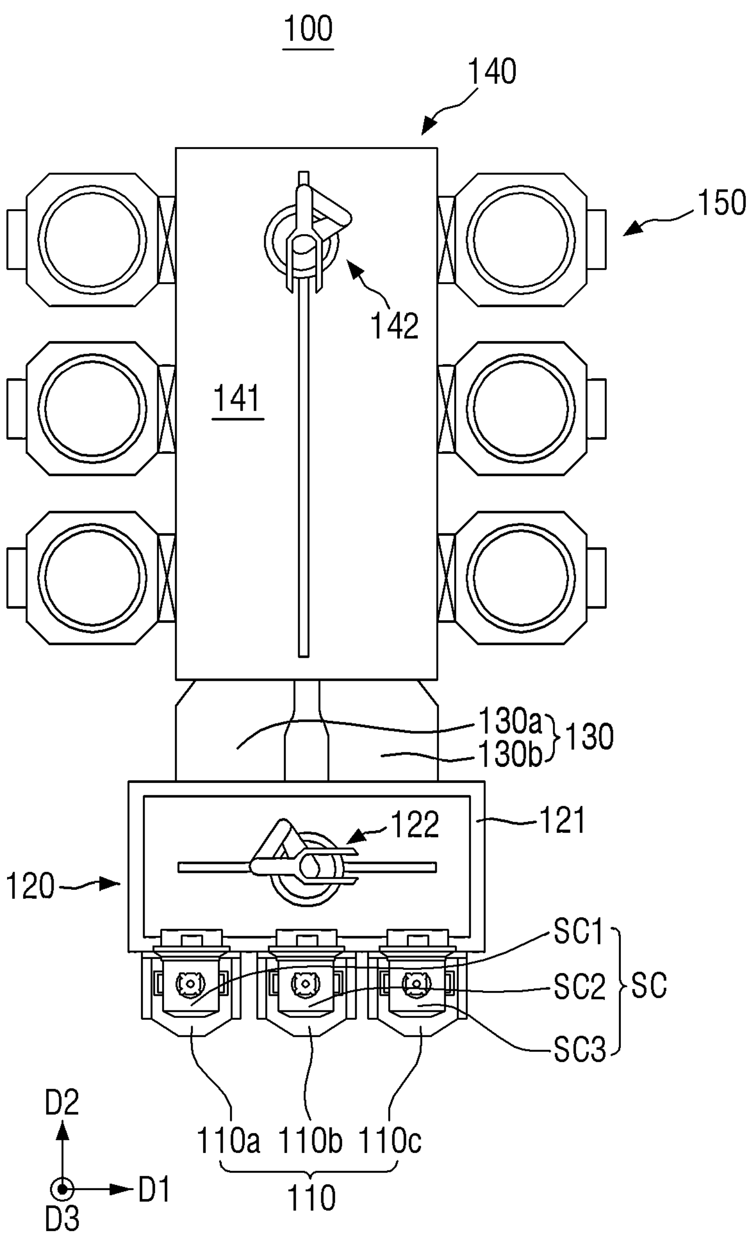
FIG. 3 is a third exemplary schematic view illustrating the internal configuration of the semiconductor manufacturing equipment for treating substrates.

FIG. 1 is a first exemplary schematic view illustrating the internal configuration of semiconductor manufacturing equipment for treating substrates. FIG. 2 is a second exemplary schematic view illustrating the internal configuration of the semiconductor manufacturing equipment for treating substrates. FIG. 3 is a third exemplary schematic view illustrating the internal configuration of the semiconductor manufacturing equipment for treating substrates.

Referring to FIGS. 1 through 3, first and second directions D1 and D2, which are horizontal directions, form a plane. For example, the first direction D1 may be a front-to-back direction, and the second direction D2 may be a left-to-right direction. Alternatively, the first direction D1 may be the left-to-right direction, and the second direction D2 may be the front-to-back direction. A third direction D3, which is a vertical direction, is perpendicular to the plane formed by the first and second directions D1 and D2. The third direction D3 may be a top-to-bottom direction.

Referring to FIGS. 1 through 3, semiconductor manufacturing equipment 100 may be configured to include load port modules 110, an index module 120, load lock chambers 130, a transfer module 140, and process chambers 150.

The semiconductor manufacturing equipment 100 is a system that treats substrates using etching, cleaning, and deposition processes. The semiconductor manufacturing equipment 100 may include a single process chamber, but the present disclosure is not limited thereto. Alternatively, the semiconductor manufacturing equipment 100 may include a plurality of process chambers. The plurality of process chambers may include homogeneous process chambers, but the present disclosure is not limited thereto. Alternatively, the plurality of process chambers may include heterogenous process chambers. When the semiconductor manufacturing equipment 100 includes multiple process chambers, the semiconductor manufacturing equipment 100 may be configured as a multi-chamber substrate treating system.

The load port modules 110 are provided to accommodate containers SC loaded with a plurality of substrates. The containers SC may be, for example, front opening unified pods (FOUPs).

The containers SC may be loaded into or unloaded from the load port modules 110. Additionally, substrates stored in the containers SC may also be loaded into or unloaded from the load port modules 110.

When targets to be loaded or unloaded are the containers SC, a container transport device may load or unload the containers SC. Specifically, the container transport device may load the containers SC into the load port modules 110 by placing the containers SC onto the load port modules 110. Also, the container transport device may unload the containers SC from the load port modules 110 by gripping the containers SC off of the load port modules 110. Although not illustrated in FIGS. 1 through 3, the container transport device may be an overhead hoist transporter (OHT).

When the targets to be loaded or unloaded are substrates, a first transport robot 122 may load or unload the substrates into or from the containers SC mounted on the load port modules 110. Specifically, when unloading the substrates, once the containers SC are mounted on the load port modules 110, the first transport robot 122 may approach the load port modules 110 and may then retrieve the substrates from the containers SC. When loading the substrates, once the treatment of the substrates is complete, the first transport robot 122 may retrieve the treated substrates from within the load lock chambers 130 and then place the treated substrates in the containers SC.

A plurality of load port modules 110 may be disposed in front of the index module 120. For example, three load port modules, i.e., first, second, and third load port modules 110*a*, 110*b*, and 110*c*, may be disposed in front of the index module 120.

When a plurality of load port modules 110 are disposed in front of the index module 120, the containers SC on the load port modules 110 may contain different types of items. For example, when the first, second, and third load port modules 110*a*, 110*b*, and 110*c* are disposed in front of the index module 120, a first container SC1 placed on the first load port module 110*a* may contain wafer-type sensors, a second container SC2 placed on the second load port module 110*b* may contain substrates or wafers, and a third container SC3 placed on the third load port module 110*c* may contain consumable parts such as focus rings, edge rings, etc.

However, the present disclosure is not limited to this. Alternatively, the first, second, and third containers SC1, SC2, and SC3 may contain items of the same type. Yet alternatively, some of the first, second, and third containers SC1, SC2, and SC3 may contain items of the same type, and the other containers may contain items of a different type.

The index module 120 may be disposed between the load port modules 110 and the load lock chambers 130 and may be provided as an interface that allows substrates to be transferred between the containers SC on the load port modules 110 and the load lock chambers 130.

The index module 120 may include a first module housing 121 and a first transport robot 122. The first transport robot 122 is disposed within the first module housing 121 and may transport substrates between the load port modules 110 and the load lock chambers 130. The internal environment of the first module housing 121 is provided at atmospheric pressure, allowing the first transport robot 122 to operate in an atmospheric pressure environment. A single first transport robot 122 may be provided within the first module housing 121, but the present disclosure is not limited thereto. Alternatively, a plurality of first transport robots 122 may be provided.

Although not illustrated in FIGS. 1 through 3, the index module 120 may also include a buffer chamber. The buffer chamber may temporarily store untreated substrates before transporting them to the load lock chambers 130. Also, the buffer chamber may temporarily store treated substrates before transporting them to the containers SC on the load port modules 110. The buffer chamber may be provided on a sidewall not adjacent to the load port modules 110 or the load lock chambers 130, but the present disclosure is not limited thereto. Alternatively, the buffer chamber may be provided on the sidewall adjacent to the load port modules 110. Yet alternatively, the buffer chamber may be provided on the sidewall adjacent to the load lock chambers 130.

A front end module (FEM) may be provided on one side of the load lock chambers 130. The FEM may include the load port modules 110 and the index module 120 and may be provided as, for example, an equipment FEM (EFEM).

As previously described, a plurality of load port modules 110 may be provided within the semiconductor manufacturing equipment 100. Referring to the examples of FIGS. 1 through 3, the load port modules 110 may be arranged in a horizontal D1, but the present disclosure is not limited thereto. Alternatively, the load port modules 110 may be stacked in the third direction D3. In a case where the load lock chambers 110 are stacked vertically, the FEM may be provided as a vertically stacked EFEM.

The load lock chambers 130 may act as a buffer chamber between the input and output ports within the semiconductor manufacturing equipment 100. That is, the load lock chambers 130 may temporarily store untreated or treated substrates between the load port modules 110 and the process chambers 150. Although not illustrated in FIGS. 1 through 3, the load lock chambers 130 may include a buffer stage for temporarily storing substrates.

A plurality of load lock chambers 130 may be disposed between the index module 120 and the transfer module 140. For example, two load lock chambers, i.e., first load lock chambers 130*a* and 130*b*, may be disposed between the index module 120 and the transfer module 140.

The load lock chambers 130 may be arranged in the same direction as the load port modules 110. Referring to the examples in FIGS. 1 through 3, the first and second load lock chambers 130*a* and 130*b* may be arranged in the same direction as the first, second, and third load port modules 110*a*, 110*b*, and 110*c*, i.e., in the first direction D1. The first and second load lock chambers 130*a* and 130*b* may be provided in a symmetrical single-layer structure where they are spaced apart from each other in the horizontal direction.

However, the present disclosure is not limited to this. Alternatively, the load lock chambers 130 may be arranged in a different direction from the load port modules 110. The first and second load lock chambers 130*a* and 130*b* may be arranged in the third direction D3 between the index module 120 and the transfer module 140. The first and second load lock chambers 130*a* and 130*b* may be provided in a double-layer structure where they are spaced apart from each other in the vertical direction.

One of the first and second load lock chambers 130*a* and 130*b* may temporarily store untreated substrates being transferred from the index module 120 to the transfer module 140, and the other load lock chamber may temporarily store treated substrates being transferred from the transfer module 140 to the index module 120. However, the present disclosure is not limited to this. The first and second load lock chambers 130*a* and 130*b* may both perform the functions of temporarily storing untreated substrates and treated substrates.

The internal environments of the load lock chambers 130 may be altered between a vacuum environment and an atmospheric pressure environment using gate valves. Specifically, when the first transport robot 122 of the index module 120 loads or unloads substrates into or from the load lock chambers 130, the load lock chambers 130 may provide an internal environment that is the same as or similar to the internal environment of the index module 120. Additionally, when a second transport robot 142 of the transfer module 140 loads or unloads substrates into or from the load lock chambers 130, the load lock chambers 130 may provide an internal environment that is the same as or similar to the internal environment of the transfer module 140. In this manner, the load lock chambers 130 may prevent changes in the internal pressure states of the index module 120 and the transfer module 140.

The transfer module 140 may be disposed between the load lock chambers 130 and the process chambers 150 and may be provided as an interface that allows substrates to be transferred between the load lock chambers 130 and the process chambers 150.

The transfer module 140 may include a second module housing 141 and the second transport robot 142. The second transport robot 142 is disposed within the second module housing 141 and may transport substrates between the load lock chambers 130 and the process chambers 150. The internal environment of the second module housing 141 may be provided as a vacuum environment, and the second transport robot 142 may operate in the vacuum environment. A single second transport robot 142 may be provided within the second module housing 141, but the present disclosure is not limited thereto. Alternatively, a plurality of second transport robots 142 may be provided.

The transfer module 140 may be connected to a plurality of process chambers 150. For this, the second module housing 141 may have a plurality of sides, and the second transport robot 142 may be provided to be freely movable through each side of the second module housing 141 to load or unload substrates into or from each of the process chambers 150.

The process chambers 150 treat substrates. When untreated substrates are provided, the process chambers 150 may process the substrates and may supply the treated substrates to the load lock chambers 130 via the transfer module 140. The process chambers 150 will be described later in further detail.

When the semiconductor manufacturing equipment 100 includes a plurality of process chambers 150, the semiconductor manufacturing equipment 100 may be formed with a cluster platform structure. For example, as illustrated in FIG. 1, the process chambers 150 may be arranged in a cluster manner around the transfer module 140, but the present disclosure is not limited thereto. Alternatively, when the semiconductor manufacturing equipment 100 includes a plurality of process chambers 150, the semiconductor manufacturing equipment 100 may be formed with a quad platform structure. For example, as illustrated in FIG. 2, the process chambers 150 may be arranged in a quad manner around the transfer module 140. Yet alternatively, when the semiconductor manufacturing equipment 100 includes a plurality of process chambers 150, the semiconductor manufacturing equipment 100 may be formed with an in-line platform structure. For example, as illustrated in FIG. 3, the process chambers may be arranged in an in-line manner around the transfer module 140, and two different process chambers 150 may be arranged in series on either side of the transfer module 140.

Although not illustrated in FIGS. 1 through 3, the semiconductor manufacturing equipment 100 may further include a control device. The control device controls the overall operation of each component of the semiconductor manufacturing equipment 100. For example, the control device may control the transport of substrates by the first transport robot 122 or the second transport robot 142, control changes in the internal environment of the load lock chambers 130, and control the treatment of substrates by the process chambers 150.

The control device may include a processor that executes control for each component of the semiconductor manufacturing equipment 100, a network that communicates with each component of the semiconductor manufacturing equipment 100 in a wired or wireless manner, and storage means for storing one or more instructions related to functions or operations for controlling each component of the semiconductor manufacturing equipment 100, processing (or treatment) recipes including instructions, and various data. In addition, the control device may further include a user interface, and the user interface includes input means for operators to perform command input operations to manage the semiconductor manufacturing equipment 100 and output means to visualize and display the operating status of the semiconductor manufacturing equipment 100. The control device may be configured as a computing device for data processing and analysis, and command delivery.

Instructions may be provided in the form of computer programs or applications. A computer program may be stored on a computer-readable recording medium and may include one or more instructions. Instructions may include code generated by a compiler, code that can be executed by an interpreter, etc. The storage means may be provided as one or more storage media selected from among a flash memory, a hard-disk drive (HDD), a solid-state drive (SSD), a card-type memory, a random-access memory (RAM), a static RAM (SRAM), a read-only memory (ROM), an electrically erasable programmable ROM (EEPROM), a programmable ROM (PROM), a magnetic memory, a magnetic disk, and an optical disk.

The process chambers 150 will hereinafter be described. The surfaces of the process chambers 150 may be formed of alumite with an anodic oxide film, and the inside of the process chambers 150 may be configured to be hermetically sealed. A plurality of process chambers 150 may be provided within the semiconductor manufacturing equipment 100, and the process chambers 150 may be spaced apart from one another around the circumference of the transfer module 140. However, the present disclosure is not limited to this. Alternatively, a single process chamber 150 may be provided within the semiconductor manufacturing equipment 100. The process chambers 150 may be provided in a cylindrical shape, but the present disclosure is not limited thereto. The process chambers 150 may also be provided in other shapes.

As previously mentioned, the process chambers 150 may treat substrates. The internal configuration of the process chambers 150 will hereinafter be described, assuming that the process chambers 150 are substrate treating apparatuses.

Figure 4:
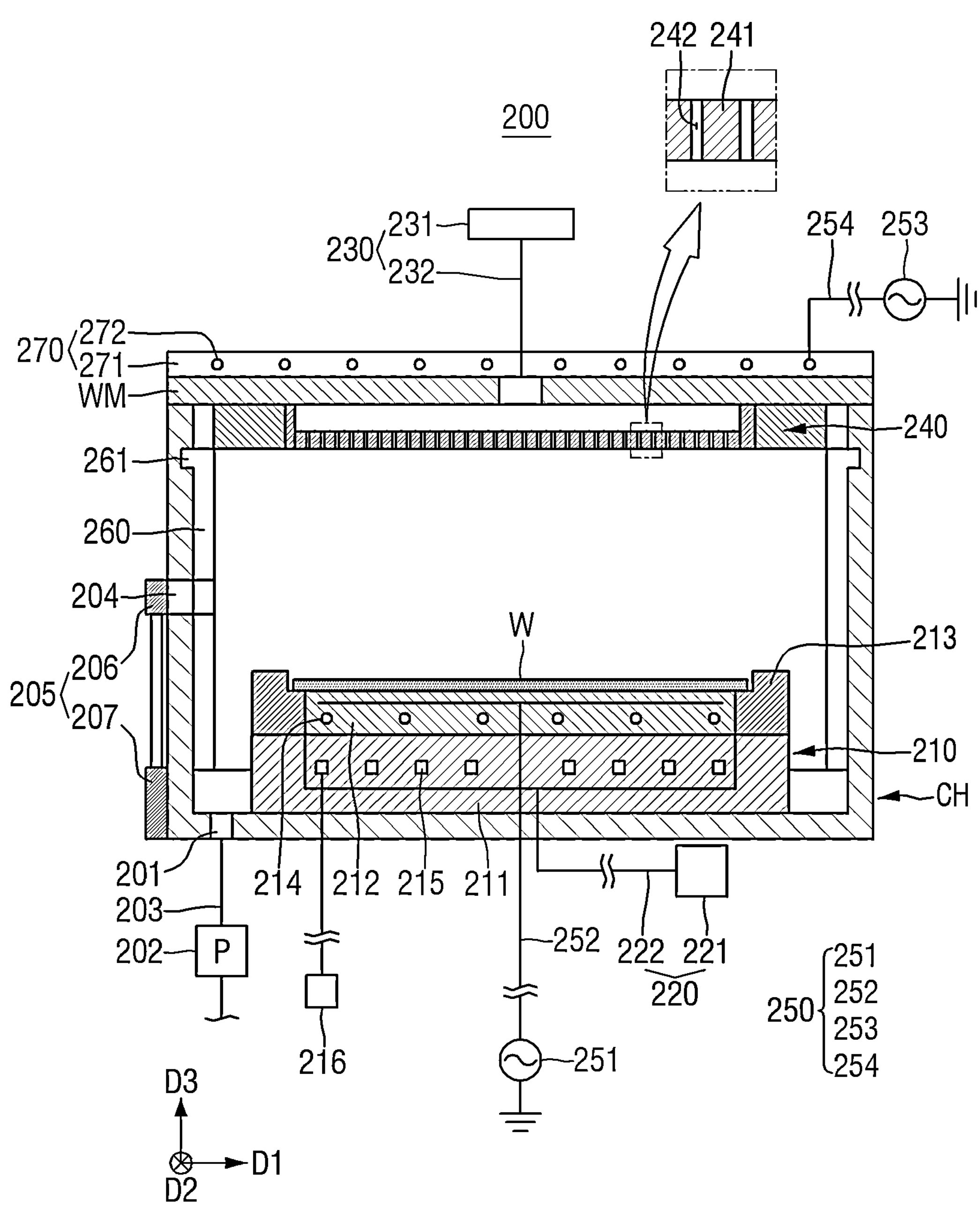
FIG. 4 is a first exemplary cross-sectional view illustrating the internal configuration of a substrate treating apparatus that constitutes the semiconductor manufacturing equipment.

FIG. 4 is a cross-sectional view illustrating the internal configuration of a substrate treating apparatus that constitutes the semiconductor manufacturing equipment. Referring to FIG. 4, a substrate treating apparatus 200 may be configured to include a chamber housing CH, a substrate support unit 210, a cleaning gas supply unit 220, a process gas supply unit 230, a showerhead unit 240, a plasma generation unit 250, a liner unit 260, a window module WM, and an antenna unit 270.

The substrate treating apparatus 200 may treat a substrate W using plasma. The substrate treating apparatus 200 may treat the substrate W using a dry method. The substrate treating apparatus 200 may treat the substrate W in, for example, a vacuum environment. The substrate treating apparatus 200 may treat the substrate W using an etching process. However, the present disclosure is not limited to this. Alternatively, the substrate treating apparatus 200 may treat the substrate W using a deposition or cleaning process.

The chamber housing CH provides a space where a process of treating the substrate W using plasma, i.e., a plasma process, takes place. The chamber housing CH may be equipped with an exhaust hole 201 at its lower part.

The exhaust hole 201 may be connected to an exhaust line 203, which is equipped with a pump 202. The exhaust hole 201 may discharge reaction byproducts generated during the plasma process and residual gases within the chamber housing CH to the outside of the chamber housing CH via the exhaust line 203. In this case, the internal space of the chamber housing CH may be depressurized.

An opening 204 may be formed by penetrating a sidewall of the chamber housing CH. The opening 204 may be provided as a passage for the substrate W to enter and exit the interior of the chamber housing CH. For example, the opening 204 may be configured to be opened and closed automatically by a door assembly 205.

The door assembly 205 may be configured to include an outer door 206 and a door actuator 207. The outer door 206 may open and close the opening 204 from an outer wall of the chamber housing CH. The outer door 206 may be movable in the height direction of the substrate treating apparatus 200, i.e., the third direction D3, under the control of the door actuator 207. The door actuator 207 may operate using at least one element selected from among a motor, a hydraulic cylinder, and a pneumatic cylinder.

The substrate support unit 210 is installed in a lower area within the chamber housing CH. The substrate support unit 210 may use an electrostatic force to attract and support the substrate W, but the present disclosure is not limited thereto.

Alternatively, the substrate support unit 210 may use various other methods such as vacuum, mechanical clamping, etc., to support the substrate W.

In the case of supporting the substrate W using an electrostatic force, the substrate support unit 210 may be configured to include a base 211 and an electrostatic chuck (ESC) 212. The ESC 212 is disposed on the base 211 and may support the substrate W mounted thereon with an electrostatic force. The base 211 may be provided as, for example, an aluminum body. The ESC 212 may be formed of, for example, a ceramic material.

A ring structure 213 is provided to surround an outer edge region of the ESC 212. In a case where a plasma process occurs within the chamber housing CH, the ring structure 213 may serve to focus ions onto the substrate W. The ring structure 213 may be formed of a silicon material. For example, the ring structure 213 may be provided as a focus ring.

Although not illustrated in FIG. 4, the substrate treating apparatus 200 may further include an edge ring that is provided to surround the outer region of the ring structure 213. The edge ring may prevent the sides of the ESC 212 from being damaged by plasma. The edge ring may be formed of, for example, an insulating material, such as quartz.

Heating elements 214 and cooling elements 215 are provided to maintain the substrate W at a processing temperature when a substrate treatment process is performed within the chamber housing CH. The heating elements 214 may be provided as heating wires to raise the temperature of the substrate W. For example, the heating elements 214 may be installed within the ESC 212. The cooling elements 215 may be provided as cooling lines through which a refrigerant flows to lower the temperature of the substrate W. For example, the cooling elements 215 may be installed within the base 211. A chiller 216 may supply the refrigerant to the cooling elements 215. The chiller 216 may use cooling water as the refrigerant, but the present disclosure is not limited thereto. Alternatively, the chiller 216 may further use a helium (He) gas as the refrigerant. Yet alternatively, the chiller 216 may use only one of cooling water and a He gas as the refrigerant.

The cleaning gas supply unit 220 provides a cleaning gas to the ESC 212 or the ring structure 213 to remove any residual foreign material on the ESC 212 or the ring structure 213. For example, the cleaning gas supply unit 220 may provide a nitrogen ($N_2$) gas as the cleaning gas.

The cleaning gas supply unit 220 may include a cleaning gas supply source 221 and a cleaning gas supply line 222. The cleaning gas supply line 222 may be connected to the space between the ESC 212 and the ring structure 213. The cleaning gas supplied by the cleaning gas supply source 221 may move through the cleaning gas supply line 222 into the space between the ESC 212 and the ring structure 213 to remove any foreign material that remains on the edge of the ESC 212 or the top of the ring structure 213.

The process gas supply unit 230 provides a process gas into the chamber housing CH. The process gas supply unit 230 may provide the process gas through a hole formed to penetrate a top cover of the chamber housing CH, i.e., a window module WM, but the present disclosure is not limited thereto. Alternatively, the process gas supply unit 230 may provide the process gas through a hole formed to penetrate a sidewall of the chamber housing CH.

The process gas supply unit 230 may include a process gas supply source 231 and a process gas supply line 232. The process gas supply source 231 may provide a gas used for treating the semiconductor substrate W as the process gas. A single process gas supply source 231 may be provided within the substrate treating apparatus 200, but the present disclosure is not limited thereto. Alternatively, a plurality of process gas supply sources 231 may be provided within the substrate treating apparatus 200. In this case, the plurality of process gas supply sources 231 may provide the same type of process gas or different types of process gases.

The showerhead unit 240 sprays the process gas provided from the process gas supply source 231 over the entire area on the semiconductor substrate W located in the internal space of the chamber housing CH. The showerhead unit 240 may be connected to the process gas supply source 231 through the process gas supply line 232.

The showerhead unit 240 is disposed in the internal space of the chamber housing CH and may include a unit body 241 and a plurality of gas feeding holes 242. The gas feeding holes 242 may be formed to penetrate the surface of the unit body 241 in the third direction D3. The gas feeding holes 242 may be spaced apart from one another at regular intervals on the surface of the unit body 241. The showerhead unit 240 may uniformly spray the process gas through the gas feeding holes 242 over the entire area of the semiconductor substrate W.

The showerhead unit 240 may be installed in the chamber housing CH to face the substrate support unit 210 in the third direction D3. The showerhead unit 240 may be provided with a larger diameter than the ESC 212, but the present disclosure is not limited thereto. Alternatively, the showerhead unit 240 may be provided with the same diameter as the ESC 212. The showerhead unit 240 may be formed of silicon as the material, but the present disclosure is not limited thereto. Alternatively, the showerhead unit 240 may be formed of a metal.

Although not illustrated in FIG. 4, the showerhead unit 240 may be divided into a plurality of sub-units. For example, the showerhead unit 240 may be divided into three sub-units, i.e., first, second, and third sub-units. The first sub-unit may be disposed at a position corresponding to a central zone of the semiconductor substrate W. The second sub-unit may be disposed to surround the outer edge of the first sub-unit. The second sub-unit may be disposed at a position corresponding to a middle zone of the semiconductor substrate W. The third sub-unit may be disposed to surround the outer edge of the second sub-unit. The third sub-unit may be disposed at a position corresponding to an edge zone of the semiconductor substrate W.

Although not illustrated in FIG. 4, when the showerhead unit 240 is divided into a plurality of sub-units, the process gas supply unit 230 may further include a process gas distributor and a process gas distribution line to distribute the process gas to each of the sub-units of the showerhead unit 240. The process gas distributor may be installed on the process gas supply line 232, and the process gas distribution line may distribute the process gas supplied from the process gas supply source 231 to each of the sub-units of the showerhead unit 240. The process gas distribution line may be a part of the process gas supply line 232 and may connect the process gas distributor to each of the sub-units of the showerhead unit 240.

The plasma generation unit 250 generates plasma from the gas remaining in a discharge space. Here, the discharge space may be the internal space of the chamber housing CH and may be formed between the showerhead unit 240 and the window module WM. Alternatively, the discharge space may be formed between the substrate support unit 210 and the showerhead unit 240. If the discharge space is formed between the substrate support unit 210 and the showerhead unit 240, the discharge space may be divided into the plasma region and the process region. The plasma region may be formed above the process region.

The plasma generation unit 250 may generate plasma in the discharge space using an inductively coupled plasma (ICP) source. For example, the plasma generation unit 250 may generate plasma in the discharge space using the ESC 212 and the antenna unit 270 as a first electrode (or a lower electrode) and a second electrode (or an upper electrode), respectively.

However, the present disclosure is not limited to this. Alternatively, the plasma generation unit 250 may use a capacitively coupled plasma (CCP) source to generate plasma in the discharge space. For example, the plasma generation unit 250 may generate plasma in the discharge space using the ESC 212 and the showerhead unit 240 as a first electrode (or a lower electrode) and a second electrode (or an upper electrode), respectively. A case where the plasma generation unit 250 uses a CCP source will be described later in further detail.

The plasma generation unit 250 may be configured to include a first high-frequency power source 251, a first transmission line 252, a second high-frequency power source 253, and a second transmission line 254.

The first high-frequency power source 251 applies radio frequency (RF) power to the first electrode. The first high-frequency power source 251 may serve as a plasma source to generate plasma within the chamber housing CH.

A single first high-frequency power source 251 may be provided within the substrate treating apparatus 200, but the present disclosure is not limited thereto. Alternatively, a plurality of first high-frequency power sources 251 may be provided within the substrate treating apparatus 200, in which case, the plurality of first high-frequency sources 251 may be arranged in parallel on the first transmission line 252.

Although not illustrated in FIG. 4, when a plurality of first high-frequency power sources 251 are provided within the substrate treating apparatus 200, the plasma generation unit 250 may include a first matching network, which is electrically connected to each of the plurality of first high-frequency power sources 251. If frequency powers with different magnitudes are input from the plurality of first high-frequency power sources 251, the first matching network may match and apply the frequency powers to the first electrode.

The first transmission line 252 may connect the first electrode and a ground source. The first high-frequency power source 251 may be installed on the first transmission line 252, but the present disclosure is not limited thereto. The first transmission line 252 may also connect the first electrode and the first high-frequency power source 251. The first transmission line 252 may be provided as, for example, an RF rod.

Although not illustrated in FIG. 4, a first impedance matching circuit for impedance matching may be provided on the first transmission line 252, which connects the first high-frequency power source 251 and the first electrode. The first impedance matching circuit may function as a lossless passive circuit and may enable maximum electrical energy to be transferred from the first high-frequency power source 251 to the first electrode.

The second high-frequency power source 253 applies RF power to the second electrode. The second high-frequency power source 253 may control the plasma characteristics within the chamber housing CH. For example, the second high-frequency power source 253 may adjust the ion bombardment energy within the chamber housing CH.

A single second high-frequency power source 253 may be provided within the substrate treating apparatus 200, but the present disclosure is not limited thereto. Alternatively, a plurality of second high-frequency power sources 253 may be provided within the substrate treating apparatus 200, in which case, the plurality of second high-frequency power sources 253 may be arranged in parallel on the second transmission line 254.

Although not illustrated in FIG. 4, when a plurality of second high-frequency power sources 253 are provided within the substrate treating apparatus 200, the plasma generation unit 250 may include a second matching network, which is electrically connected to each of the plurality of second high-frequency power sources 253. If frequency powers with different magnitudes are input from the plurality of second high-frequency power sources 253, the second matching network may match and apply the frequency powers to the second electrode.

The second transmission line 254 connects the first electrode and the ground source. The second high-frequency power source 253 may be installed on the second transmission line 254.

Although not illustrated in FIG. 4, a second impedance matching circuit for impedance matching may be provided on the second transmission line 254, which connects the second high-frequency power source 253 and the second electrode. The second impedance matching circuit may function as a lossless passive circuit and may enable maximum electrical energy to be transferred from the second high-frequency power source 253 to the second electrode.

Meanwhile, the second high-frequency power source 253, like the first high-frequency power source 251, may control the plasma characteristics within the chamber housing CH.

The liner unit 260, also referred to as a wall liner, protects the interior of the chamber housing CH from arc discharges generated during the excitation of the process gas or from impurities produced during the treatment of the semiconductor substrate W. The liner unit 260 may be formed to cover the inner walls of the chamber housing CH.

The liner unit 260 may include a support ring 262 on its body. The support ring 262 may protrude in an outward direction (i.e., the first direction D1) from an upper part of the body of the liner unit 260 and may secure the body of the liner unit 260 to the chamber housing CH.

The window module WM serves as an upper cover for the chamber housing CH, sealing the internal space of the chamber housing CH. The window module WM may be provided separately from the chamber housing CH, but the present disclosure is not limited thereto. Alternatively, the window module WM may be integrated as part of the chamber housing CH. When provided separately from the chamber housing CH, the window module WM may cover the open top of the chamber housing CH. When integrated as part of the chamber housing CH, the window module WM may be provided in an integral structure with the chamber housing CH.

The window module WM may be formed as a dielectric window, using an insulating material. For example, the window module WM may be formed of alumina ($Al_2O_3$). The window module WM may also include a coating film on its surface to suppress particle formation when a plasma process is performed within the internal space of the chamber housing CH.

The antenna unit 270 generates magnetic and electric fields within the internal space of the chamber housing CH to excite the process gas into plasma. The antenna unit 270 may operate using RF power supplied from the second high-frequency power source 253. The antenna unit 270 may be provided on the chamber housing CH. For example, the antenna unit 270 may be provided on the window module WM, but the present disclosure is not limited thereto. Alternatively, the antenna unit 270 may be provided on a sidewall of the chamber housing CH.

The antenna unit 270 may include a body 271 and an antenna 272 either within the body 271 or on the surface of the body 271. The antenna 272 may be provided to form a closed loop using a coil. The antenna 272 may be formed in various shapes, such as a spiral shape, along the width direction of the chamber housing CH, i.e., the first direction D1.

The antenna unit 270 may be formed to have a planar structure, but the present disclosure is not limited thereto. Alternatively, the antenna unit 270 may be formed to have a cylindrical structure. When formed in a planar structure, the antenna unit 270 may be provided on the chamber housing CH. When formed in a cylindrical structure, the antenna unit 270 may be provided to surround the outer walls of the chamber housing CH.

A case where the plasma generation unit 250 uses an ICP source to generate plasma in the discharge space has been described so far with reference to FIG. 4. A case where the plasma generation unit 250 uses a CCP source to generate plasma in the discharge space will hereinafter be described with reference to FIGS. 5 and 6, focusing mainly on the differences with the embodiment of FIG. 4.

Figure 5:
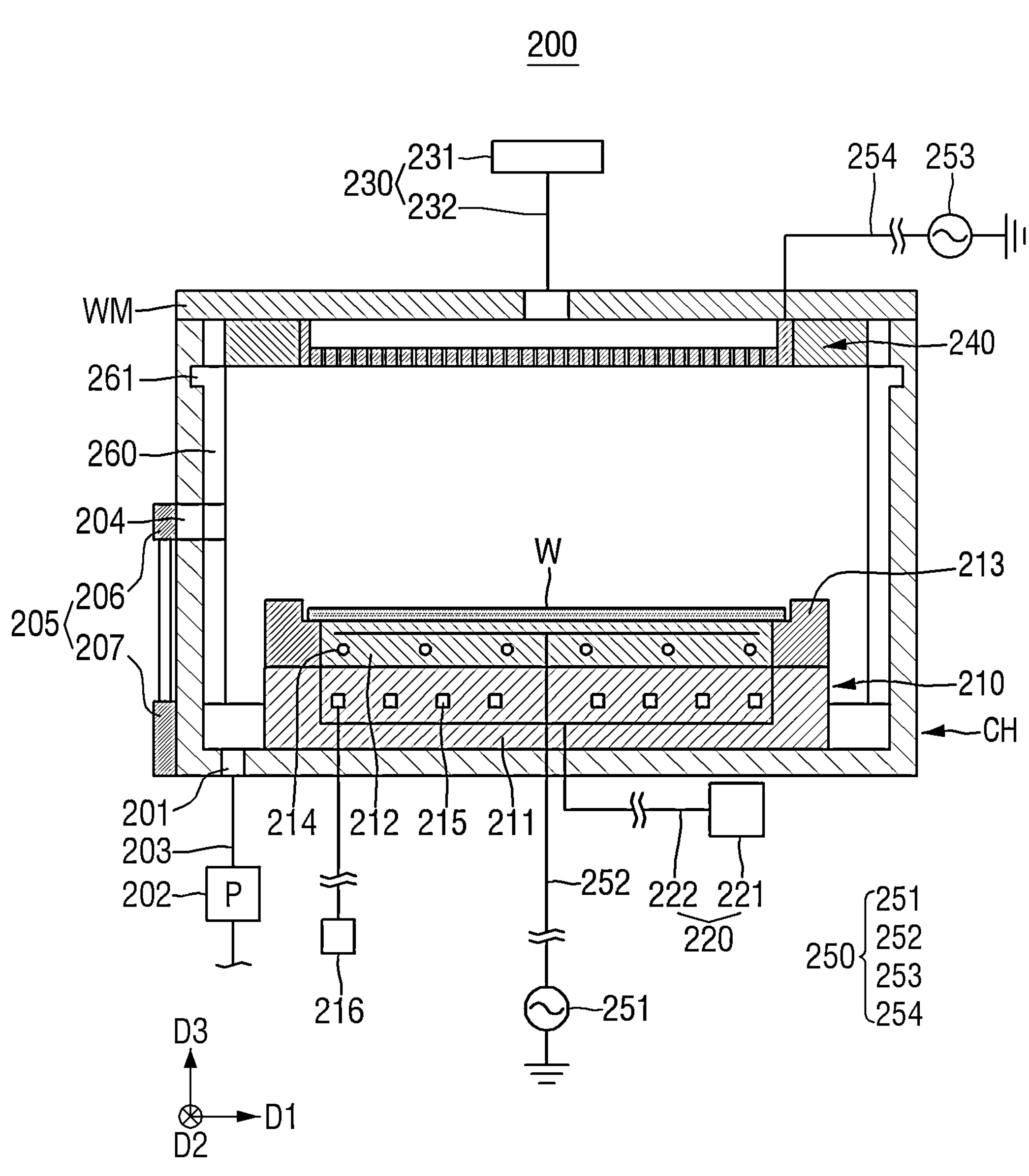
FIG. 5 is a second exemplary cross-sectional view illustrating the internal configuration of the substrate treating apparatus that constitutes the semiconductor manufacturing equipment.
Figure 6:
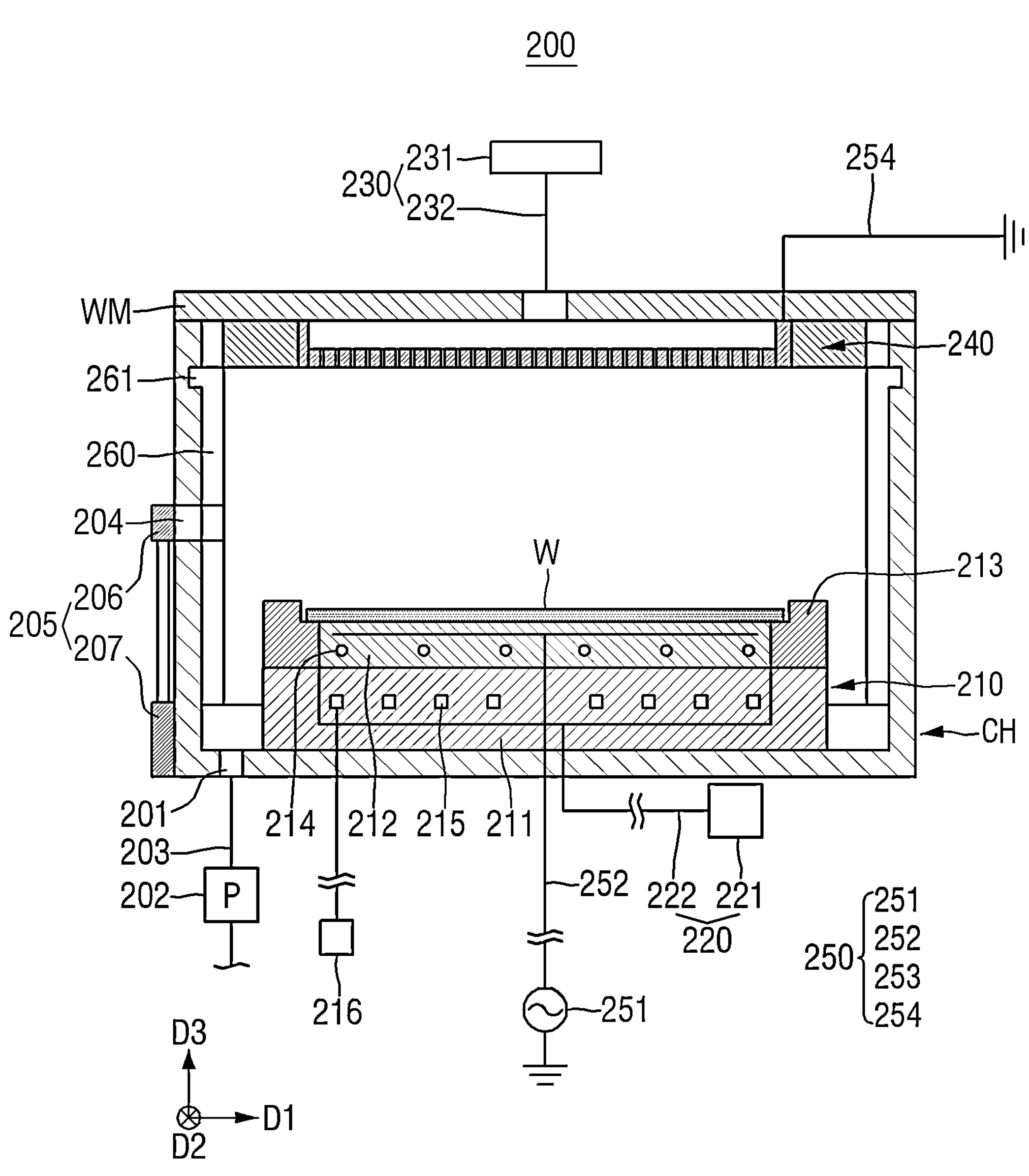
FIG. 6 is a third exemplary cross-sectional view illustrating the internal configuration of the substrate treating apparatus that constitutes the semiconductor manufacturing equipment.

FIG. 5 is a second exemplary cross-sectional view illustrating the internal configuration of the substrate treating apparatus that constitutes the semiconductor manufacturing equipment. FIG. 6 is a third exemplary cross-sectional view illustrating the internal configuration of the substrate treating apparatus that constitutes the semiconductor manufacturing equipment.

Referring to FIGS. 5 and 6, the substrate treating apparatus 200 may be configured to include a chamber housing CH, a substrate support unit 210, a cleaning gas supply unit 220, a process gas supply unit 230, a showerhead unit 240, a plasma generation unit 250, a liner unit 260, a baffle unit 270, and a window module WM. In other words, the substrate treating apparatus 200, unlike its counterpart of FIG. 4, may not include an antenna unit 270.

Referring to FIG. 5, the plasma generation unit 250 may be configured to include a first high-frequency power source 251, a first transmission line 252, a second high-frequency power source 253, and a second transmission line 254, but the present disclosure is not limited thereto. Alternatively, referring to FIG. 6, the plasma generation unit 250 may be configured to include the first high-frequency power source 251, the first transmission line 252, and the second transmission line 254, but not the second high-frequency power source 253.

Referring to the example of FIG. 4, the second transmission line 254 may be connected to the antenna 272 of the antenna unit 270, and the second high-frequency power source 253 may apply RF power to the antenna 272 of the antenna unit 270. On the contrary, referring to the example of FIG. 5, the second transmission line 254 may be connected to a body 241 of the showerhead unit 240, and the second high-frequency power source 253 may apply RF power to the body 241 of the showerhead unit 240.

In the example of FIG. 5, the second high-frequency power source 253 may be installed on the second transmission line 254. In the example of FIG. 6, the second high-frequency power source 253 may not be installed on the second transmission line 254. If the second high-frequency power source 253 is installed on the second transmission line 254, the plasma generation unit 250 may apply multiple frequencies to the substrate treating apparatus 200.

An inspecting apparatus 300 for inspecting the semiconductor manufacturing equipment 100 will hereinafter be described. The inspecting apparatus 300 can inspect the semiconductor manufacturing equipment 100 with high reliability without destroying the semiconductor manufacturing equipment 100.

Figure 7:
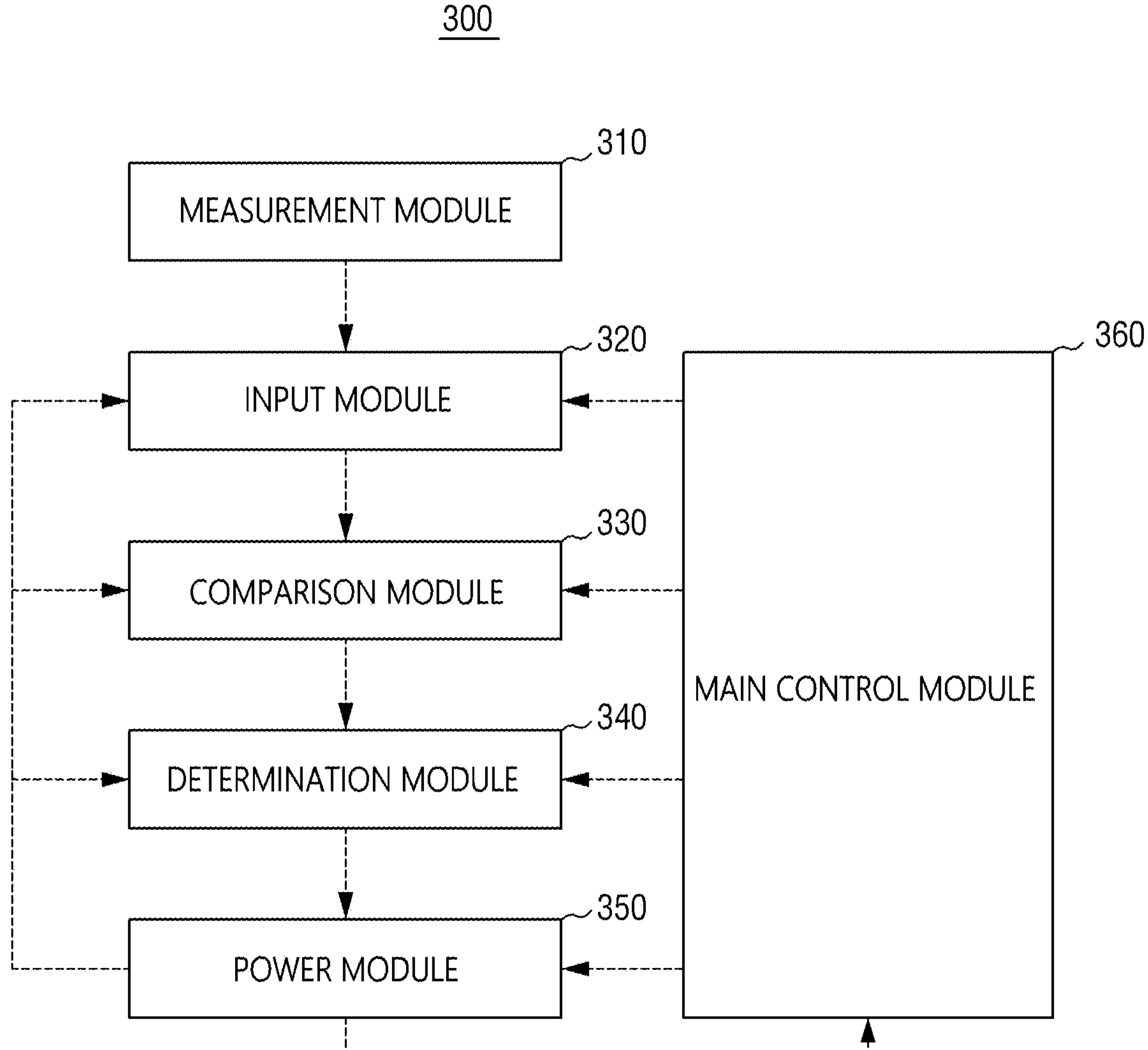
FIG. 7 is a first exemplary block diagram illustrating the internal configuration of an inspecting apparatus that constitutes the semiconductor manufacturing equipment.

FIG. 7 is a first exemplary block diagram illustrating the internal configuration of the inspecting apparatus that constitutes the semiconductor manufacturing equipment. Referring to FIG. 7, the inspecting apparatus 300 may be configured to include a measurement module 310, an input module 320, a comparison module 330, a determination module 340, a power module 350, and a main control module 360.

The inspecting apparatus 300 may inspect the semiconductor manufacturing equipment 100 based on an input impedance measurement theory. For example, the inspecting apparatus 300 may inspect the substrate treating apparatus 200 within the semiconductor manufacturing equipment 100 based on the input impedance measurement theory. The inspecting apparatus 300 may determine whether the substrate treating apparatus 200 is operating properly based on the input impedance measurement theory.

Figure 8:
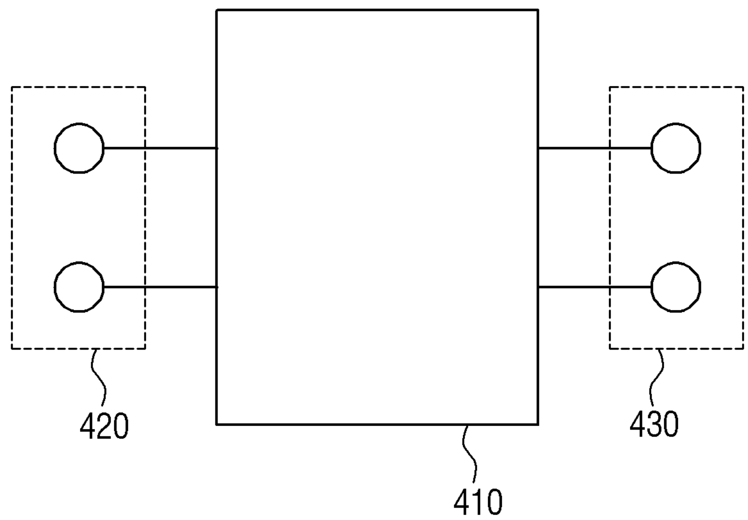
FIG. 8 is an exemplary schematic view illustrating an input impedance measurement theory.

The inspecting apparatus 300 may inspect the substrate treating apparatus 200 based on the input impedance measurement theory when terminal resistors are open. Referring to FIG. 8, a first port 420 may be provided on one side of an equipment part 410, and a second port 430 may be provided on the other side of the equipment part 410. The input impedance measurement theory may represent the relationship between the impedances measured at the first and second ports 420 as a mathematical equation. The input impedance measurement theory may be applied to measure the unique characteristics of the equipment part 410 at each of the first and second ports 420 and 430.

When the resistor installed at the second port 430 is open, the impedance measured at the second port 430 may have an infinite value (∞). In this case, the impedance measured at the first port 420 may be calculated based on the input impedance measurement theory, as shown in Equation (1):

$$Zin = Z0/j\tan(\beta 1) \quad (1)$$

where Zin denotes the impedance measured at the first port 420, Z0 denotes the characteristic impedance of the equipment part 410, β denotes the wave propagation constant of the equipment part 410, and l denotes the length of the equipment part 410. FIG. 8 is an exemplary schematic view illustrating the input impedance measurement theory.

The inspecting apparatus 300 may inspect the substrate treating apparatus 200 while the substrate treating apparatus 200 is in operation. The inspecting apparatus 300 may inspect the substrate treating apparatus 200 without destroying the substrate treating apparatus 200. The inspecting apparatus 300 may inspect each equipment part 410 within the substrate treating apparatus 200. The inspecting apparatus 300 may inspect the equipment part 410 before the equipment part 410 is installed in the substrate treating apparatus 200. The inspecting apparatus 300 may inspect the equipment part 410 before the equipment part 410 is removed from the substrate treating apparatus 200. The inspecting apparatus 300 may inspect the equipment part 410 when necessary, for example, when inspection of the equipment part 410 is required according to specifications.

The measurement module 310 may measure a first impedance at the first port 420 of the equipment part 410. The first impedance may be defined by Equation (2):

$$Z1=R1+jX1 \tag{2}$$

where Z1 denotes the first impedance, R1 denotes the resistance measured at the first port 420, and X1 denotes the reactance measured at the first port 420. The resistance and the reactance measured at the first port 420 will hereinafter be referred to as the first resistance and the first reactance, respectively.

The measurement module 310 may measure a second impedance at the second port 430 of the equipment part 410. The second impedance may be defined by Equation (3):

$$Z2=R2+jX2 \tag{3}$$

where Z2 denotes the second impedance, R2 denotes the resistance measured at the second port 430, and X2 denotes the reactance measured at the second port 430. The resistance and the reactance measured at the second port 430 will hereinafter be referred to as the second resistance and the second reactance, respectively.

The measurement module 310 may measure both the first and second impedances at the same time. In this case, the measurement module 310 may include two impedance meters. Specifically, the measurement module 310 may include a first impedance meter for measuring the first impedance and a second impedance meter for measuring the second impedance, but the present disclosure is not limited thereto. Alternatively, the measurement module 310 may measure one of the first and second impedances first and then measure the other impedance, in which case, the measurement module 310 may include a single impedance meter.

The measurement module 310 may measure the first and second impedances whenever the frequency used by the substrate treating apparatus 200 changes. For example, when the substrate treating apparatus 200 uses a first frequency, the measurement module 310 may measure the first and second impedances. After a predetermined amount of time has elapsed, if the substrate treating apparatus 200 uses a second frequency different from the first frequency, the measurement module 310 may measure the first and second impedances again. The first and second frequencies may be selected from the range of 1 Hz to 300 MHz.

The equipment part 410 may be a component installed within the substrate treating apparatus 200. For example, the equipment part 410 may be an RF rod associated with an RF path, a dielectric body, a metal part or element, a cable, etc., but the present disclosure is not limited thereto. In another example, the equipment part 410 may be the substrate treating apparatus 200 itself.

The input module 320 may receive the first and second impedances measured by the measurement module 310. The input module 320 may be connected to the measurement module 310 in a wired or wireless manner to receive the first and second impedances.

The comparison module 330 may compare the first and second impedances. For example, the comparison module 330 may compare the first and second resistances. Additionally, the comparison module 330 may compare the first and second reactances.

As previously mentioned, the first impedance may be calculated by Equation (1). If the resistor installed at the second port 430 is open, the first impedance may be calculated based on the characteristic impedance of the equipment part 410, the propagation constant of the equipment part 410, and the length of the equipment part 410. Similarly, if the resistor at the first port 420 is open, the second impedance may also be calculated based on the characteristic impedance of the equipment part 410, the propagation constant of the equipment part 410, and the length of the equipment part 410. The first and second impedances may have the same value under the assumption that the resistors at the first and second ports 420 and 430 are open.

The comparison module 330 may compare the first and second impedances using an absolute value comparison method. In this case, the absolute value of a calculated value from the first and second resistances may be compared with a first reference value, and the absolute value of a calculated value from the first and second reactances may be compared with a second reference value.

The comparison module 330 may compare the first and second impedances using a difference comparison method. In this case, the difference between the first and second resistances may be compared with a third reference value, and the difference between the first and second reactances may be compared with a fourth reference value.

The determination module 340 may determine the presence of an anomaly in the equipment part 410 based on the results obtained by comparing the first and second impedances. As previously mentioned, the comparison module 330 may compare the first and second impedances using either the absolute value comparison method or the difference comparison method. The determination module 340 may determine the presence of an anomaly in the equipment part 410 in consideration of the type of comparison method used by the comparison module 330.

When the comparison module 330 uses the absolute value comparison method to compare the first and second impedances, the determination module 340 may determine the presence of an anomaly in the equipment part 410 based on whether the absolute value of the calculated value from the first and second resistances is less than or equal to the first reference value. Here, the calculated value from the first and second resistances may be the difference between the first and second resistances or may be a maximum or minimum selected from between the first and second resistances.

The determination module 340 may determine the presence of an anomaly in the equipment part 410 based on Equation (4):

$$|R1, R2| \le a \tag{4}$$

where R1 and R2 denote the first and second resistances, respectively, |R1, R2| represents the absolute value of the calculated value from the first and second resistances R1 and R2, and a denotes the first reference value. The determination module 340 may determine that there is no anomaly in the equipment part 410 if the absolute value of the calculated value from the first and second resistances is equal to or less than the first reference value. Conversely, if the absolute value of the calculated value from the first and second resistances is greater than the first reference value, the determination module 340 may determine that there is an anomaly in the equipment part 410.

When the comparison module 330 uses the absolute value comparison method to compare the first and second impedances, the determination module 340 may determine the presence of an anomaly in the equipment part 410 based on whether the absolute value of the calculated value from the first and second reactances is less than or equal to the second reference value. Here, the calculated value from the first and second reactances may be the difference between the first and second reactances or may be a maximum or minimum selected from between the first and second reactances.

The determination module 340 may determine the presence of an anomaly in the equipment part 410 based on Equation (5):

$$|X1, X2| \leq b \tag{5}$$

where X1 and X2 denote the first and second reactances, respectively, |X1, X2| represents the absolute value of the calculated value from the first and second reactances X1 and X2, and b denotes the second reference value. The determination module 340 may determine that there is no anomaly in the equipment part 410 if the absolute value of the calculated value from the first and second reactances is equal to or less than the second reference value. Conversely, if the absolute value of the calculated value from the first and second reactances is greater than the second reference value, the determination module 340 may determine that there is an anomaly in the equipment part 410.

Figure 9:
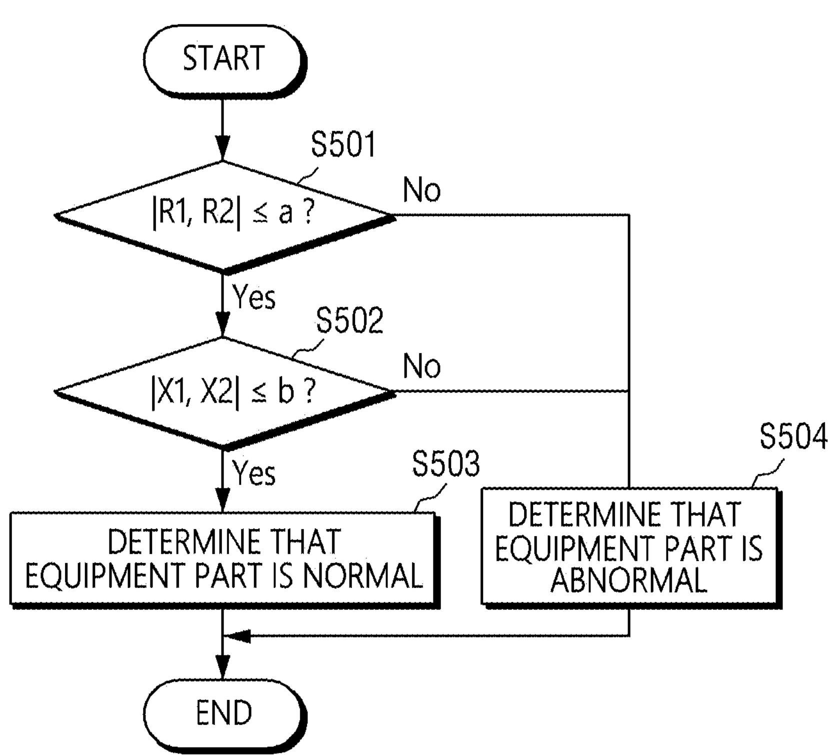
FIG. 9 is a first exemplary flowchart illustrating a method of determining the presence of an anomaly in an equipment part, performed by a determination module that constitutes the inspecting apparatus.

The determination module 340 may determine the presence of an anomaly in the equipment part 410 in consideration of both Equations (4) and (5). Referring to FIG. 9, if the absolute value of the calculated value from the first and second resistances is less than or equal to the first reference value (S501) and the absolute value of the calculated value from the first and second reactances is less than or equal to the second reference value (S502), the determination module 340 may determine that there is no anomaly in the equipment part 410 (S503). That is, if Equations (4) and (5) are both satisfied (S501 and S502), the determination module 340 may determine that there is no anomaly in the equipment part 410 (S503).

Conversely, the determination module 340 may determine that there is an anomaly in the equipment part 410 (S504) if the absolute value of the calculated value from the first and second resistances is less than or equal to the first reference value (S501) but the absolute value of the calculated value from the first and second reactances exceeds the second reference value (S502). Alternatively, if the absolute value of the calculated value from the first and second reactances is less than or equal to the second reference value but the absolute value of the calculated value from the first and second resistances exceeds the first reference value, the determination module 340 may determine that there is an anomaly in the equipment part 410 (S504). Yet alternatively, if the absolute value of the calculated value from the first and second resistances and the absolute value of the calculated value from the first and second reactances both exceed the first and second reference values, respectively, the determination module 340 may determine that there is an anomaly in the equipment part 410 (S504). That is, if any one of Equations (4) and (5) is not satisfied (S501, S502), the determination module 340 determination module 340 may determine that there is an anomaly in the equipment part 410 (S504). FIG. 9 is a first exemplary flowchart illustrating a method of determining the presence of an anomaly in an equipment part, performed by the determination module that constitutes the inspecting apparatus.

Figure 10:
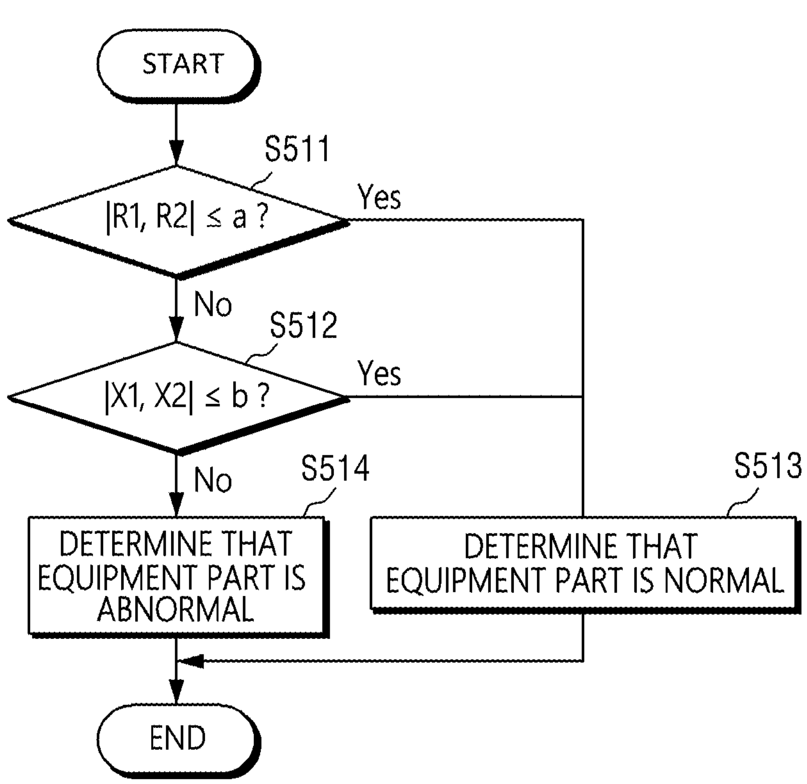
FIG. 10 is a second exemplary flowchart illustrating the method of determining the presence of an anomaly in an equipment part, performed by the determination module that constitutes the inspecting apparatus.

The determination module 340 may determine the presence of an anomaly in the equipment part 410 in consideration of each of Equations (4) and (5) separately. Referring to FIG. 10, if the absolute value of the calculated value from the first and second resistances exceeds the first reference value (S511) and the absolute value of the calculated value from the first and second reactances exceeds the second reference value (S512), the determination module 340 may determine that there is an anomaly in the equipment part 410 (S514). That is, if Equations (4) and (5) are both not satisfied (S511 and S512), the determination module 340 may determine that there is an anomaly in the equipment part 410 (S514).

Conversely, the determination module 340 may determine that there is no anomaly in the equipment part 410 (S513) if the absolute value of the calculated value from the first and second resistances exceeds the first reference value (S511) but the absolute value of the calculated value from the first and second reactances is less than or equal to the second reference value (S512). Alternatively, if the absolute value of the calculated value from the first and second reactances exceeds the second reference value but the absolute value of the calculated value from the first and second resistances is less than or equal to the first reference value, the determination module 340 may determine there is no anomaly in the equipment part 410. Yet alternatively, if the absolute value of the calculated value from the first and second resistances and the absolute value of the calculated value from the first and second reactances are both less than or equal to the first and second reference values, respectively, the determination module 340 may determine there is no anomaly in the equipment part 410. That is, if any one of Equations (4) and (5) is satisfied (S511 and S512), the determination module 340 may determine that there is no anomaly in the equipment part 410 (S513). FIG. 10 is a second exemplary flowchart illustrating the method of determining the presence of an anomaly in an equipment part, performed by the determination module that constitutes the inspecting apparatus.

Figure 11:
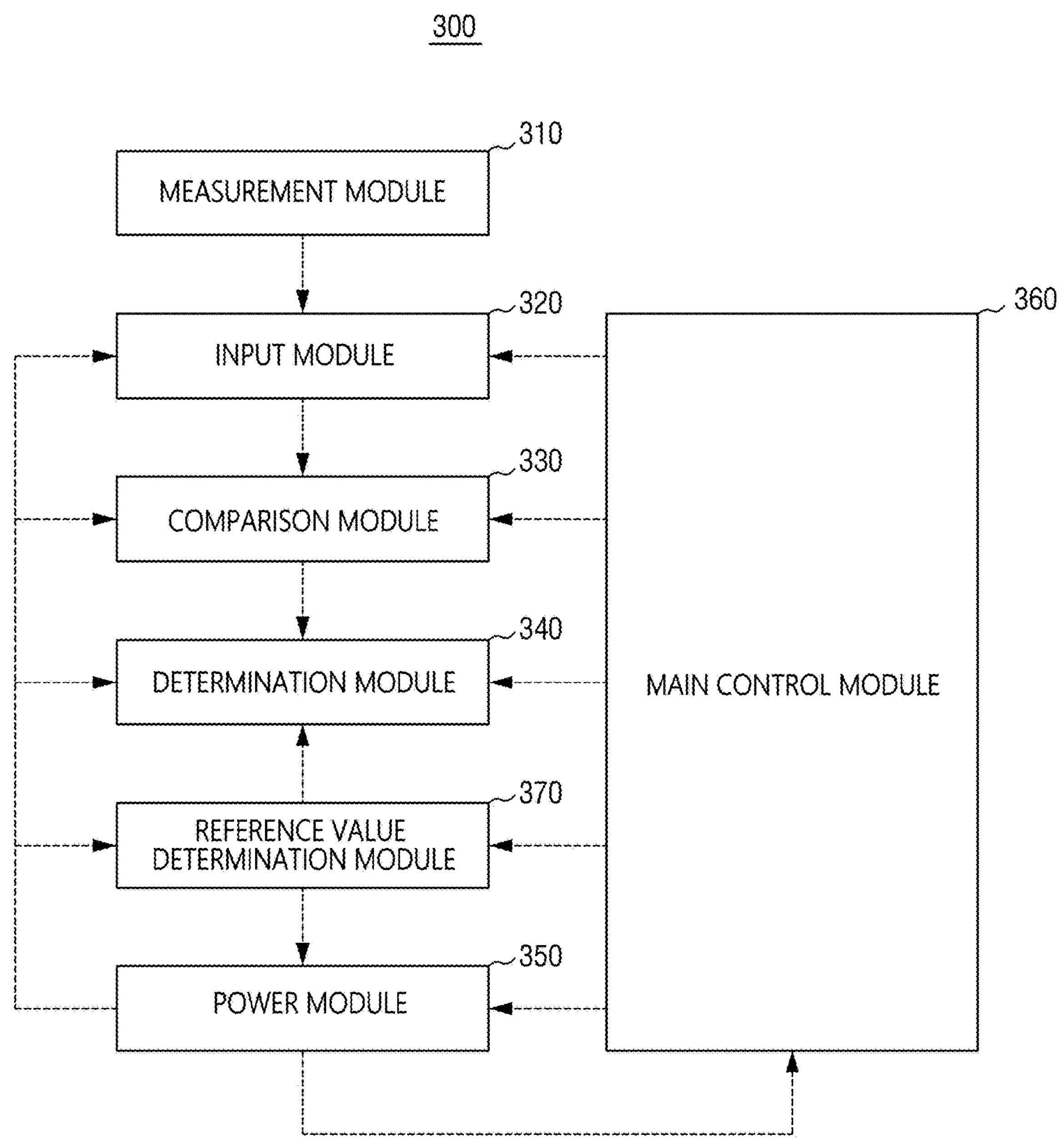
FIG. 11 is a second exemplary block diagram illustrating the internal configuration of the inspecting apparatus that constitutes the semiconductor manufacturing equipment.

The inspecting apparatus 300 may determine the first and second reference values to determine the presence of an anomaly in the equipment part 410. The inspecting apparatus 300 may further include a reference value determination module 370. FIG. 11 is a second exemplary block diagram illustrating the internal configuration of the inspecting apparatus for semiconductor manufacturing equipment.

The reference value determination module 370 may determine the first reference value. The reference value determination module 370 may also determine the second reference value. The module 370 may set the first and second reference values to be different. The reference value determination module 370 may determine the first and second reference values differently based on the shape, length, and material of the equipment part 410. The reference value determination module 370 may determine the first reference value differently based on the frequency value. Similarly, the reference value determination module 370 may determine the second reference value differently based on the frequency value.

If the comparison module 330 uses the difference comparison method to compare the first and second impedances, the determination module 340 may determine the presence of an anomaly in the equipment part 410 based on whether the difference between the first and second resistances is less than or equal to the third reference value.

The determination module 340 may determine the presence of an anomaly in the equipment part 410 based on Equation (6):

$$(R1-R2)\leq c \tag{6}$$

where (R1–R2) represents the difference between the first and second resistors R1 and R2 and c denotes the third reference value. The determination module 340 may determine that there is no anomaly in the equipment part 410 if the difference between the first and second resistances is equal to or less than the third reference value. On the contrary, the determination module 340 may determine that there is an anomaly in the equipment part 410 if the difference between the first and second resistances is greater than the third reference value.

Meanwhile, instead of the difference between the first and second resistances, i.e., (R1–R2), the maximum or minimum selected from between the first and second resistances, i.e., Max (R1, R2) or Min (R1, R2), may also be applicable to Equation (6).

If the comparison module 330 uses the difference comparison method to compare the first and second impedances, the determination module 340 may determine the presence of an anomaly in the equipment part 410 based on whether the difference between the first and second reactances is less than or equal to the fourth reference value.

The determination module 340 may determine the presence of an anomaly in the equipment part 410 based on Equation (7):

$$(X1-X2)\leq d \tag{7}$$

where (X1–X2) represents the difference between the first and second reactances X1 and X2 and d denotes the fourth reference value. The determination module 340 may determine that there is no anomaly in the equipment part 410 if the difference between the first and second reactances is equal to or less than the fourth reference value. On the other hand, the determination module 340 may determine that there is an anomaly in the equipment part 410 if the difference between the first and second reactances is greater than the fourth reference value.

Meanwhile, instead of the difference between the first and second reactances, i.e., (X1–X2), the maximum or minimum selected from between the first and second reactances, i.e., Max (X1, X2) or Min (X1, X2), may also be applicable to Equation (7).

Figure 12:
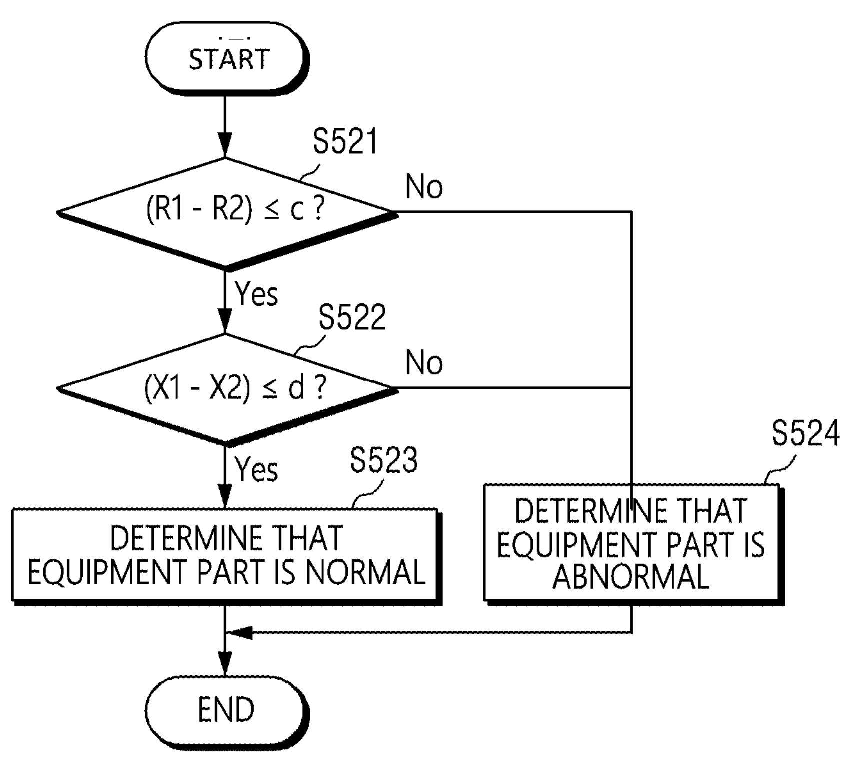
FIG. 12 is a third exemplary flowchart illustrating the method of determining the presence of an anomaly in an equipment part, performed by the determination module that constitutes the inspecting apparatus.

The determination module 340 may determine the presence of an anomaly in the equipment part 410 in consideration of both Equations (6) and (7). Referring to FIG. 12, the determination module 340 may determine that there is no anomaly in the equipment part 410 (S523) if the difference between the first and second resistances is less than or equal to the third reference value (S521) and the difference between the first and second reactances is less than or equal to the fourth reference value (S522). In other words, the determination module 340 may determine that there is no anomaly in the equipment part 410 (S523) if Equations (6) and (7) are both satisfied (S521 and S522).

On the other hand, the determination module 340 may determine that there is an anomaly in the equipment part 410 if the difference between the first and second resistances is less than or equal to the third reference value (S521) but the difference between the first and second reactances exceeds the fourth reference value (S522). Alternatively, the determination module 340 may determine that there is an anomaly in the equipment part 410 if the difference between the first and second reactances is less than or equal to the fourth reference value but the difference between the first and second resistances exceeds the third reference value. Yet alternatively, the determination module 340 may determine that there is an anomaly in the equipment part 410 if the difference between the first and second resistances and the difference between the first and second reactances both exceed the third and fourth reference values, respectively. That is, the determination module 340 may determine that there is an anomaly in the equipment part 410 (S524) if any one of Equations (6) and (7) is not satisfied (S521 and S522). FIG. 12 is a third exemplary flowchart illustrating the method of determining the presence of an anomaly in an equipment part, performed by the determination module that constitutes the inspecting apparatus.

Figure 13:
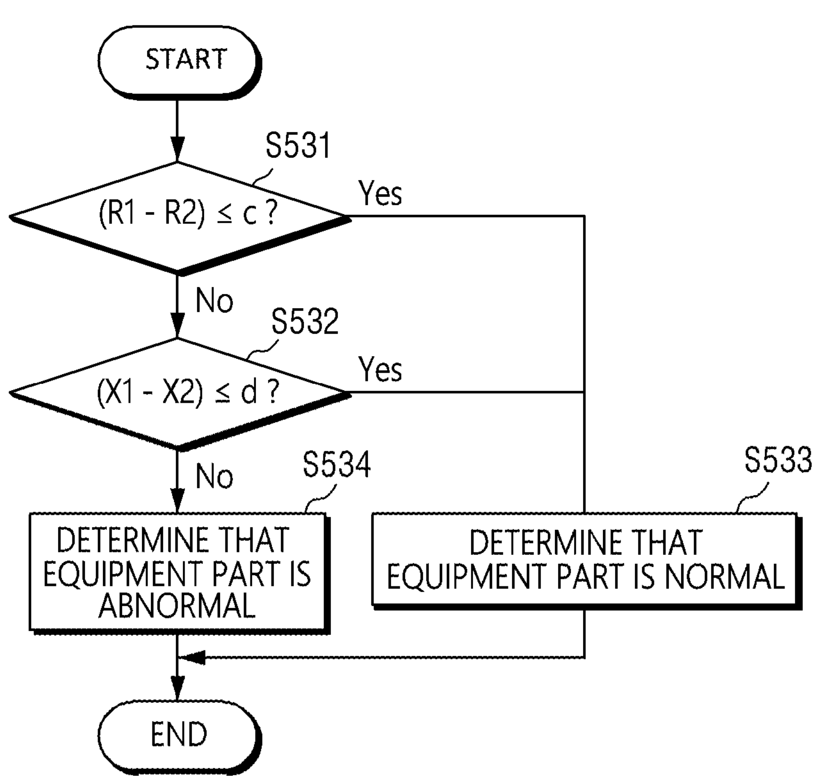
FIG. 13 is a fourth exemplary flowchart illustrating the method of determining the presence of an anomaly in an equipment part, performed by the determination module that constitutes the inspecting apparatus.

The determination module 340 may determine the presence of an anomaly in the equipment part 410 in consideration of each of Equations (6) and (7) separately. Referring to FIG. 13, the determination module 340 may determine that there is an anomaly in the equipment part 410 (S534) if the difference between the first and second resistances exceeds the third reference value (S531) and the difference between the first and second reactances exceeds the fourth reference value (S532). That is, the determination module 340 may determine that there is an anomaly in the equipment part 410 (S534) if both Equations (6) and (7) are not satisfied at the same time (S531 and S532).

Conversely, the determination module 340 may determine that there is no anomaly in the equipment part 410 if the difference between the first and second resistances exceeds the third reference value (S531) but the difference between the first and second reactances is less than or equal to the fourth reference value (S532). Alternatively, the determination module 340 may determine that there is no anomaly in the equipment part 410 if the difference between the first and second reactances exceeds the fourth reference value but the difference between the first and second resistances is less than or equal to the third reference value. Yet alternatively, the determination module 340 may determine that there is no anomaly in the equipment part 410 if the difference between the first and second resistances and the difference between the first and second reactances are both less than or equal to the third and fourth reference values, respectively. In other words, the determination module 340 may determine that there is an anomaly in the equipment part 410 (S533) if any one of Equations (6) and (7) is satisfied (S531, S532). FIG. 13 is a fourth exemplary flowchart illustrating the method of determining the presence of an anomaly in the equipment part, performed by the determination module that constitutes the inspecting apparatus.

The reference value determination module 370 may determine the third and fourth reference values. The reference value determination module 370 may determine the third and fourth reference values in the same manner as the first and second reference values. For example, the reference value determination module 370 may determine the third and fourth reference values differently based on the shape, length, and material of the equipment part 410. Additionally, the reference value determination module 370 may determine the third and fourth reference values differently based on the frequency used.

Referring again to FIG. 7, the power module 350 may provide power to the input module 320, the comparison module 330, the determination module 340, the reference value determination module 370, and the main control module 360 to ensure their smooth operation, but the present disclosure is not limited thereto. The power module 350 may also provide power to the measurement module 310. The power module 350 may provide power to the measurement module 310 in a wired or wireless manner.

The main control module 360 may control the overall operations of the input module 320, the comparison module 330, the determination module 340, the power module 350, and the reference value determination module 370 to ensure their smooth operation, but the present disclosure is not limited thereto. The main control module 360 may also control the overall operation of the measurement module 310.

The input module 320, the comparison module 330, the determination module 340, the reference value determination module 370, the power module 350, and the main control module 360 may be provided as computing devices similar to the control device for the transmission, analysis, and processing of data. In other words, the input module 320, the comparison module 330, the determination module 340, the reference value determination module 370, the power module 350, and the main control module 360 may be provided as computing devices including processors, networks, instructions, memory means, and user interfaces.

Embodiments of the present disclosure have been described above with reference to the accompanying drawings, but the present disclosure is not limited thereto and may be implemented in various different forms. It will be understood that the present disclosure can be implemented in other specific forms without changing the technical concept or gist of the present disclosure. Therefore, it should be understood that the embodiments set forth herein are illustrative in all respects and not limiting.

What is claimed is:

1. An inspecting apparatus comprising:

a measurement module configured to measure a first impedance at a first port, which is provided on one side of an equipment part in a substrate treating apparatus, and a second impedance at a second port, which is provided on the other side of the equipment part;

a comparison module configured to compare the first and second impedances; and a determination module configured to determine whether the equipment part is operating properly based on a result of the comparison of the first and second impedances, wherein the first impedance includes a first resistance and a first reactance, the second impedance includes a second resistance and a second reactance, and the determination module determines whether the equipment part is operating properly based on at least one of a result of the comparison of the first and second resistances and a result of the comparison of the first and second reactances.

2. The inspecting apparatus of claim 1, wherein the measurement module measures a characteristic impedance of the equipment part at the first port as the first impedance.

3. The inspecting apparatus of claim 2, wherein the measurement module measures the first impedance at the first port with a resistor installed at the second port open.

4. The inspecting apparatus of claim 1, wherein the measurement module measures a characteristic impedance of the equipment part at the second port as the second impedance.

5. The inspecting apparatus of claim 4, wherein the measurement module measures the second impedance at the second port with a resistor installed at the first port open.

6. The inspecting apparatus of claim 1, wherein the measurement module measures the first and second impedances whenever a frequency used by the substrate treating apparatus changes.

7. The inspecting apparatus of claim 1, wherein the comparison module compares the first and second impedances using one of an absolute value comparison method and a difference comparison method.

8. The inspecting apparatus of claim 7, wherein the absolute value comparison method compares an absolute value of a calculated value from the first and second resistances with a first reference value and an absolute value of a calculated value from the first and second reactances with a second reference value.

9. The inspecting apparatus of claim 7, wherein the difference comparison method compares a difference between the first and second resistances with a third reference value and a difference between the first and second reactances with a fourth reference value.

10. The inspecting apparatus of claim 1, wherein the determination module determines whether the equipment part is operating normally based on at least one of first and second conditions, the first condition is whether the result of the comparison of the first and second resistances is equal to or less than a first or third reference value, and the second condition is whether the result of the comparison of the first and second reactances is equal to or less than a second or fourth reference value.

11. The inspecting apparatus of claim 10, wherein the determination module determines that the equipment part is operating properly if the first and second conditions are both satisfied.

12. The inspecting apparatus of claim 10, wherein the determination module determines that the equipment part is operating properly if at least one of the first and second conditions is satisfied.

13. The inspecting apparatus of claim 10, wherein the result of the comparison of the first and second resistances is either an absolute value of a calculated value from the first and second resistances or a difference between the first and second resistances.

14. The inspecting apparatus of claim 13, wherein the calculated value from the first and second resistances is either the difference between the first and second resistances or a maximum or minimum selected from between the first and second resistances.

15. The inspecting apparatus of claim 10, wherein the result of the comparison of the first and second reactances is either an absolute value of a calculated value from the first and second reactances or a difference between the first and second reactances.

16. The inspecting apparatus of claim 15, wherein the calculated value from the first and second reactances is either the difference between the first and second reactances or a maximum or minimum selected from between the first and second reactances.

17. The inspecting apparatus of claim 10, further comprising:
a reference value determination module configured to determine the first, second, third, and fourth reference values.

18. The inspecting apparatus of claim 17, wherein the reference value determination module determines the first, second, third, and fourth reference values differently depending on a frequency used by the substrate treating apparatus.

19. Semiconductor manufacturing equipment comprising:
a substrate treating apparatus configured to treat substrates using plasma; and
an inspecting apparatus configured to determine whether an equipment part in the substrate treating apparatus is operating properly,
wherein
the inspecting apparatus includes: a measurement module configured to measure a first impedance at a first port, which is provided on one side of an equipment part in a substrate treating apparatus, and a second impedance at a second port, which is provided on the other side of the equipment part; a comparison module configured to compare the first and second impedances; and a determination module configured to determine whether the equipment part is operating properly based on a result of the comparison of the first and second impedances,
the first impedance includes a first resistance and a first reactance,
the second impedance includes a second resistance and a second reactance, and
the determination module determines whether the equipment part is operating properly based on at least one of a result of the comparison of the first and second resistances and a result of the comparison of the first and second reactances.

20. An inspecting apparatus inspecting an equipment part in a substrate treating apparatus, based on an input impedance measurement theory, the inspecting apparatus comprising:
a measurement module configured to measure a first impedance at a first port, which is provided on one side of the equipment part, and a second impedance at a second port, which is provided on the other side of the equipment part;
a comparison module configured to compare the first and second impedances; and
a determination module configured to determine whether the equipment part is operating properly based on a result of the comparison of the first and second impedances,
wherein
the first impedance includes a first resistance and a first reactance,
the second impedance includes a second resistance and a second reactance,
the comparison module compares the first and second resistances and compares the first and second reactances, using one of an absolute value comparison method and a difference comparison method,
the determination module determines whether the equipment part is operating normally based on at least one of first and second conditions,
the first condition is whether a result of the comparison of the first and second resistances is equal to or less than a first or third reference value,
the second condition is whether a result of the comparison of the first and second reactances is equal to or less than a second or fourth reference value, and
the determination module determines that the equipment part is operating properly if the first and second conditions are both satisfied.

* * * * *